(12) United States Patent
Riegler et al.

(10) Patent No.: US 12,014,973 B2
(45) Date of Patent: Jun. 18, 2024

(54) MULTI-DIE-PACKAGE AND METHOD

(71) Applicant: Infineon Technologies Austria AG, Villach (AT)

(72) Inventors: Andreas Riegler, Lichtpold (AT); Christian Fachmann, Fuernitz (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/368,169

(22) Filed: Jul. 6, 2021

(65) Prior Publication Data

US 2021/0335696 A1 Oct. 28, 2021

Related U.S. Application Data

(62) Division of application No. 16/193,514, filed on Nov. 16, 2018, now Pat. No. 11,081,430.

(30) Foreign Application Priority Data

Nov. 17, 2017 (DE) .......................... 102017127089.2

(51) Int. Cl.
*H01L 21/768* (2006.01)
*H01L 21/48* (2006.01)
(Continued)

(52) U.S. Cl.
CPC .... *H01L 23/49562* (2013.01); *H01L 21/4825* (2013.01); *H01L 21/4839* (2013.01); *H01L 21/78* (2013.01); *H01L 23/3107* (2013.01); *H01L 23/4951* (2013.01); *H01L 23/49558* (2013.01); *H01L 23/49575* (2013.01); *H01L 23/49551* (2013.01); *H01L 23/49568* (2013.01);
(Continued)

(58) Field of Classification Search
None
See application file for complete search history.

(56) References Cited

U.S. PATENT DOCUMENTS 6,228,548 B1 5/2001 King et al.
7,271,470 B1 9/2007 Otremba
(Continued)

FOREIGN PATENT DOCUMENTS

CN 104377138 A 2/2015
DE 102014106823 A1 11/2014

*Primary Examiner* — Ali Naraghi
(74) *Attorney, Agent, or Firm* — Murphy, Bilak & Homiller, PLLC

(57) ABSTRACT

A method includes providing a processed first wafer having front and back sides and including power semiconductor dies implemented within the wafer by processing its front side, each die having a first load terminal at the front side and a second load terminal at the back side; providing an unprocessed second wafer made of an electrically insulating material and having first and second opposing sides; forming a plurality of recesses within the second wafer; filling the plurality of recesses with a conductive material; forming a stack by attaching, prior or subsequent to filling the recesses, the second wafer to the front side of the first wafer, the conductive material electrically contacting the first load terminals of the power semiconductor dies; and ensuring that the conductive material provides an electrical connection between the first side and the second side of the second wafer.

6 Claims, 8 Drawing Sheets

(51) Int. Cl.
  *H01L 21/78*   (2006.01)
  *H01L 23/31*   (2006.01)
  *H01L 23/495*  (2006.01)
  *H02M 1/42*        (2007.01)
  *H02M 7/00*        (2006.01)
  *H02M 7/06*        (2006.01)

(52) U.S. Cl.
  CPC .......... *H02M 1/4225* (2013.01); *H02M 7/003* (2013.01); *H02M 7/06* (2013.01)

(56) References Cited

U.S. PATENT DOCUMENTS

| | | | |
|---|---|---|---|
| 8,410,592 B2 | 4/2013 | Otremba et al. | |
| 8,642,394 B2 | 2/2014 | Mohamed et al. | |
| 9,899,281 B2* | 2/2018 | Shen | H01L 25/50 |
| 2005/0161785 A1 | 7/2005 | Kawashima et al. | |
| 2007/0018313 A1* | 1/2007 | Gomyo | H01L 25/105 |
| | | | 257/E21.503 |
| 2008/0087913 A1 | 4/2008 | Otremba et al. | |
| 2009/0189259 A1 | 7/2009 | Mohamed et al. | |
| 2009/0194868 A1* | 8/2009 | Chong | H01L 23/3107 |
| | | | 257/E23.101 |
| 2009/0269886 A1* | 10/2009 | Yamazaki | H01L 21/6835 |
| | | | 438/597 |
| 2012/0223433 A1* | 9/2012 | Jee | B23K 35/262 |
| | | | 257/772 |
| 2014/0063744 A1 | 3/2014 | Lopez et al. | |
| 2014/0076613 A1 | 3/2014 | Mahler et al. | |
| 2014/0264611 A1* | 9/2014 | Lee | H01L 23/49562 |
| | | | 438/109 |
| 2014/0339694 A1 | 11/2014 | Von Koblinski et al. | |
| 2015/0001599 A1 | 1/2015 | Cho | |
| 2017/0040425 A1* | 2/2017 | Kueck | H01L 29/0619 |
| 2017/0213787 A1* | 7/2017 | Alfano | H01L 24/81 |

* cited by examiner

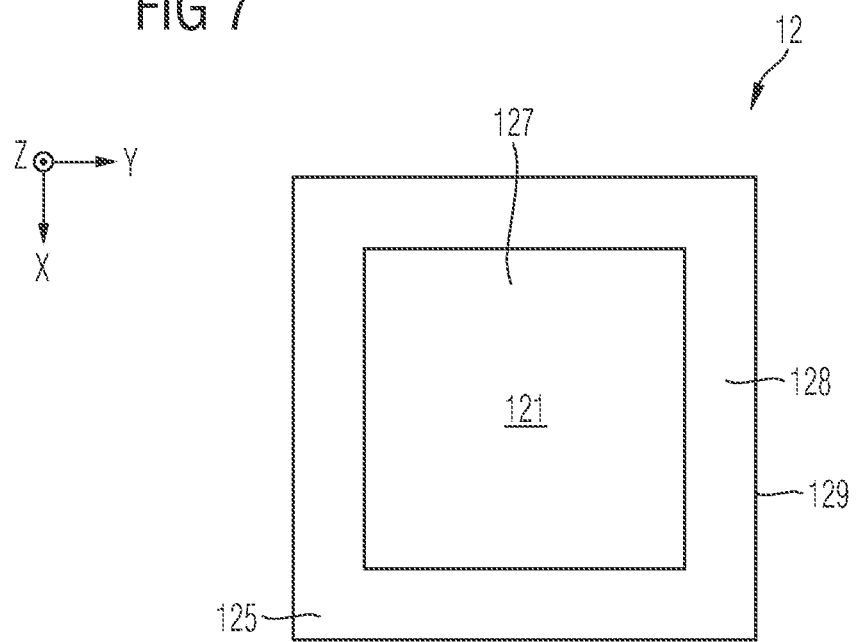

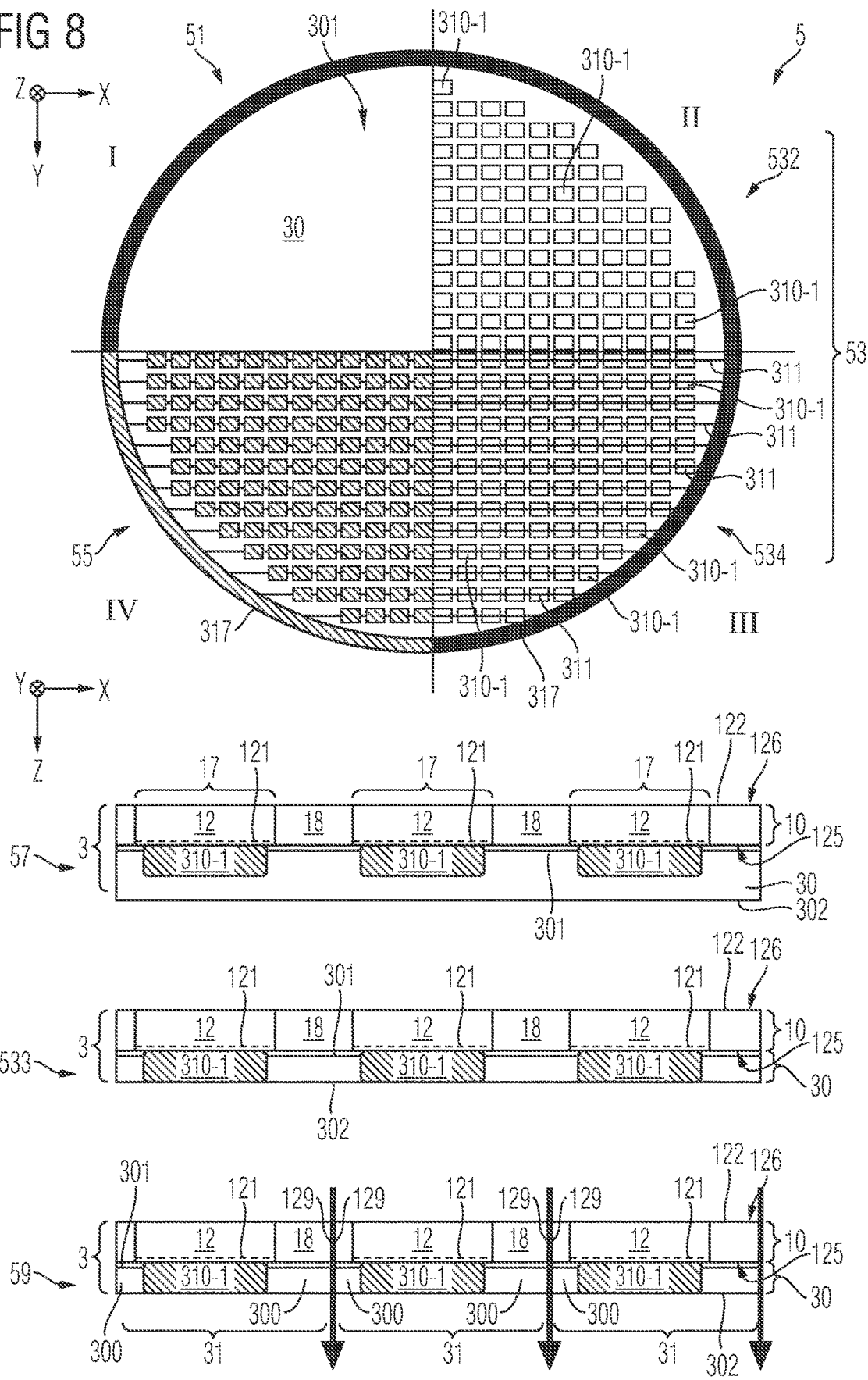

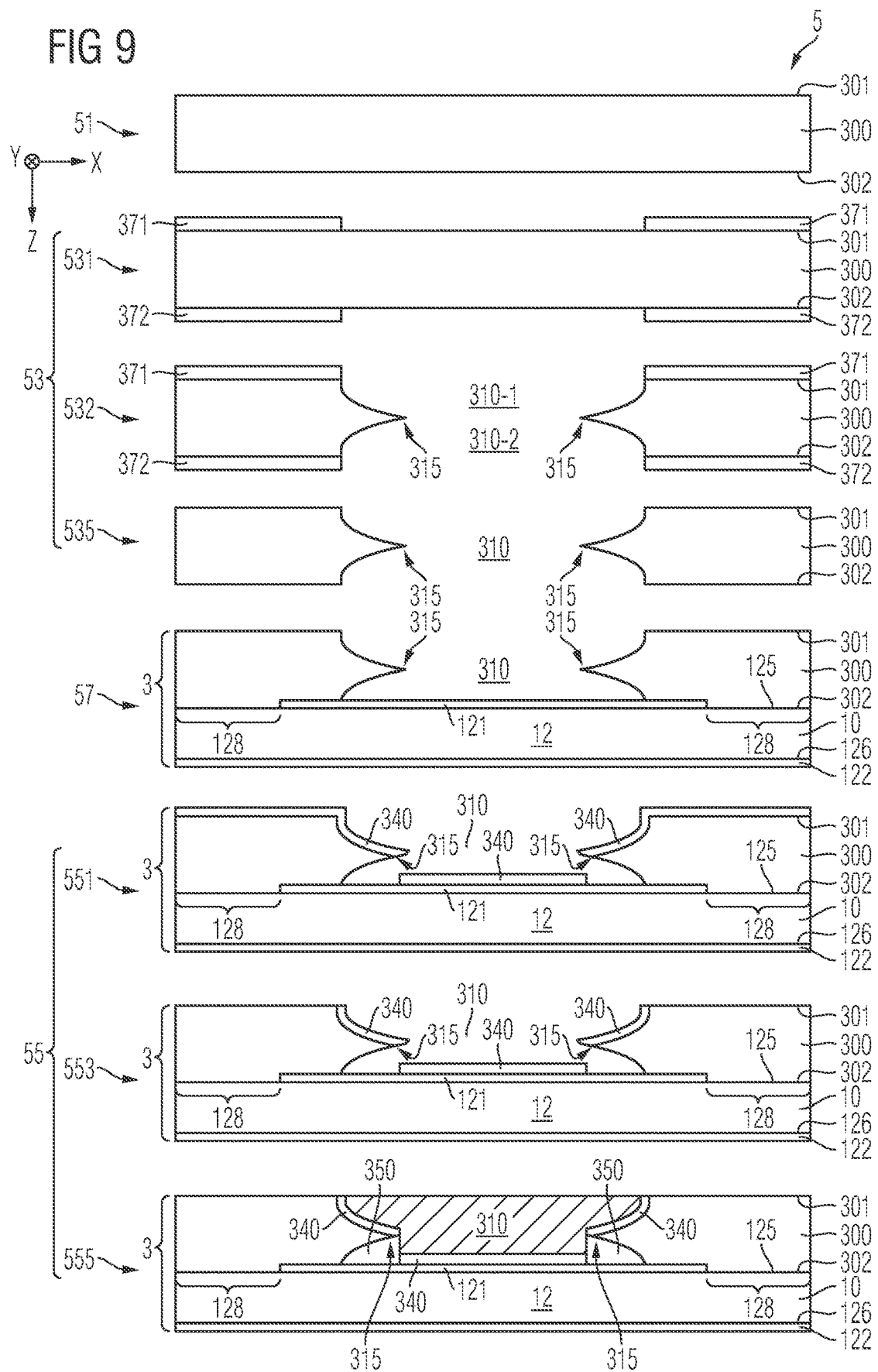

MULTI-DIE-PACKAGE AND METHOD

TECHNICAL FIELD

This specification refers to embodiments of a package enclosing a first power semiconductor die and a second power semiconductor die. This specification further refers to embodiments of a method of processing a semiconductor wafer. In addition, this specification refers to embodiments of a power converter.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power converters, e.g., power supplies.

A power semiconductor device usually comprises one or more power semiconductor dies, each integrated in a single chip, and configured to conduct a load current along a load current path between two load terminals of the die. Further, the load current path may be controlled, e.g., by means of an insulated electrode, sometimes referred to as gate electrode. For example, upon receiving a corresponding control signal from, e.g., a driver, the control electrode may set the power semiconductor device in one of a conducting state and a blocking state.

After the power semiconductor die has been manufactured, it is usually installed within in a package, e.g., in a manner that allows the package with the enclosed die to be arranged within an application, e.g., in a power converter, e.g., such that the enclosed die may be coupled to a support, e.g., a printed circuit board (PCB).

For example, a first power semiconductor die, e.g., a transistor, is enclosed within a first package, and, separate therefrom, a second power semiconductor die, e.g., a diode, is enclosed within a second package. The first package and the second package may be installed within an application, e.g., mounted on a PCB, separately from each other. By electrically connecting the first package and the second package to each other, as well as further components, a power converter may be formed.

It is usually desirable to provide a power converter with a compact design, low power losses and low stray inductances, wherein power losses and/or stray inductances may be caused, e.g., by an electrical path that connects two packages arranged separately from each other.

SUMMARY

According to an embodiment, a package encloses a first power semiconductor die and a second power semiconductor die. The package has a package body with a package top side and a package footprint side. Each of the first power semiconductor die and the second power semiconductor die exhibits a respective front side and, opposite thereof, a respective back side, wherein the first power semiconductor die has a first load terminal arranged at its front side and a second load terminal arranged at its back side, and wherein the second power semiconductor die has a first load terminal arranged at its front side and a second load terminal arranged at its back side. The package comprises a lead frame structure configured to electrically and mechanically couple the package to a support with the package footprint side facing to the support. The lead frame structure comprises: a) a common base, wherein the second load terminal of the first power semiconductor die is electrically connected to the common base with its back side facing to the common base, and wherein the first load terminal of the second power semiconductor die is electrically connected to the common base with its front side facing to the common base; b) a common outside terminal extending out of the package body and being electrically connected with the common base; c) a first outside terminal extending out of the package body and being electrically connected with the first load terminal of the first power semiconductor die; and d) a second outside terminal extending out of the package body, the second outside terminal being electrically connected with the second load terminal of the second power semiconductor die and electrically insulated from the first outside terminal.

According to a further embodiment, a power converter is configured to receive an input power signal from an input power source and to convert the input power signal into an output power signal and to provide the output power signal for a load, wherein the power converter comprises at least one package. The at least one package encloses a first power semiconductor die and a second power semiconductor die. The at least one package has a package body with a package top side and a package footprint side. Each of the first power semiconductor die and the second power semiconductor die exhibits a respective front side and, opposite thereof, a respective back side, wherein the first power semiconductor die has a first load terminal arranged at its front side and a second load terminal arranged at its back side, and wherein the second power semiconductor die has a first load terminal arranged at its front side and a second load terminal arranged at its back side. The at least one package comprises a lead frame structure configured to electrically and mechanically couple the at least one package to a support with the package footprint side facing to the support. The lead frame structure comprises: a) a common base, wherein the second load terminal of the first power semiconductor die is electrically connected to the common base with its back side facing to the common base, and wherein the first load terminal of the second power semiconductor die is electrically connected to the common base with its front side facing to the common base; b) a common outside terminal extending out of the package body and being electrically connected with the common base; c) a first outside terminal extending out of the package body and being electrically connected with the first load terminal of the first power semiconductor die; and d) a second outside terminal extending out of the package body, the second outside terminal being electrically connected with the second load terminal of the second power semiconductor die and electrically insulated from the first outside terminal.

According to a further embodiment, a method comprises: providing a processed first wafer, the first wafer having a front side and a back side and including a plurality of power semiconductor dies that have been implemented within the first wafer by processing its front side, each of the power semiconductor dies having a first load terminal at the front side and a second load terminal at the back side; providing an unprocessed second wafer made of an electrically insulating material and having a first side and a second side opposite thereof; forming a plurality of recesses within the second wafer; filling the plurality of recesses with a conductive material; forming a stack by attaching, prior or subsequent to said filling step, the second wafer to the front side of the first wafer, wherein the conductive material electrically contacts the first load terminals of the power semiconductor dies; and ensuring that the conductive material provides an electrical connection between the first side and the second side of the second wafer.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures reference numerals may designate corresponding parts. In the drawings:

FIG. 7 schematically and exemplarily illustrates a section of a horizontal projection of a second power semiconductor die in accordance with one or more embodiments;

FIG. 8 schematically and exemplarily illustrates, based on sections of horizontal projections and sections of vertical cross-sections, a flow-diagram of a method in accordance with one or more embodiments;

FIG. 9 schematically and exemplarily illustrates, based on sections of vertical cross-sections, a flow-diagram of a method in accordance with one or more embodiments.

DETAILED DESCRIPTION

Figure 1A:
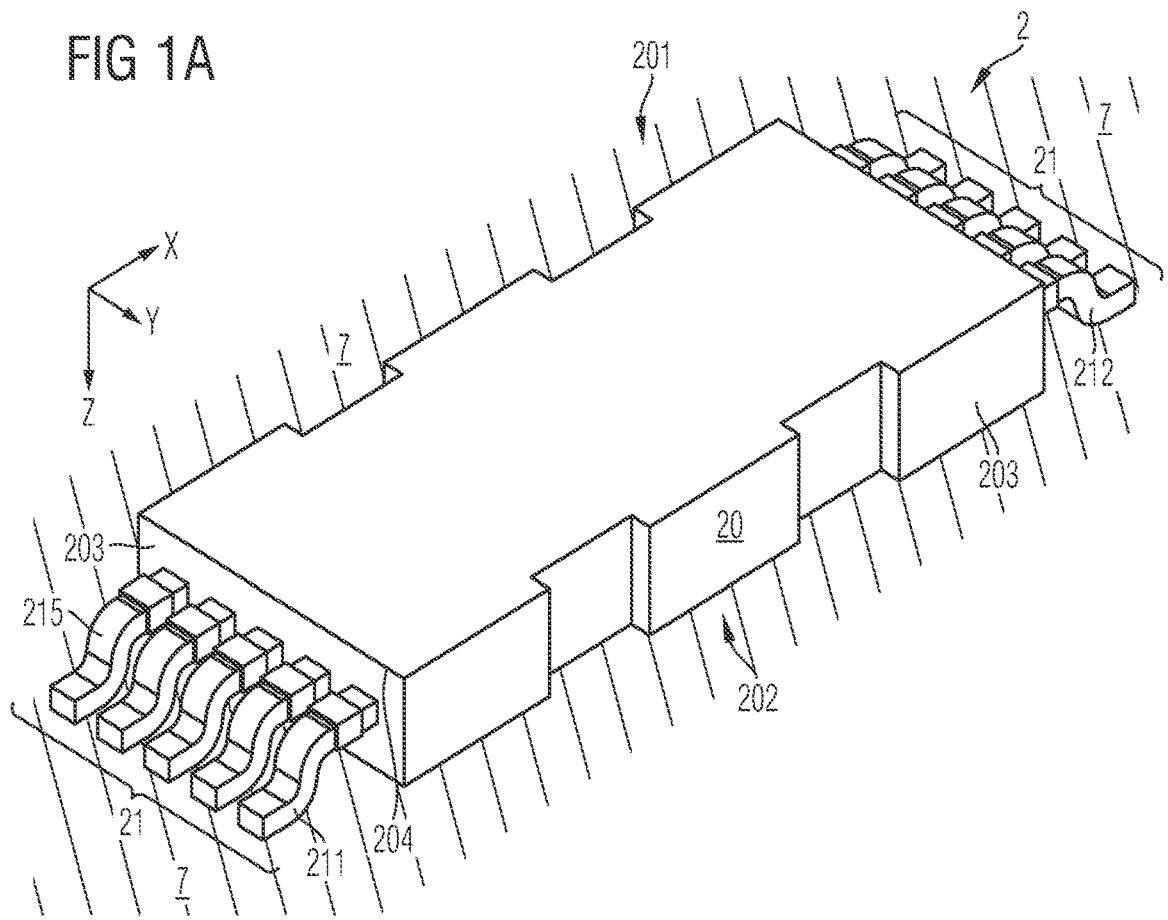
FIGS. 1A-1B each schematically and exemplarily illustrate a section of a perspective view of a package in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, one or more power semiconductor dies, e.g., power semiconductor dies that may be used within a power converter, e.g., a power supply. Thus, in an embodiment, the power semiconductor dies can each be configured to carry a load current that is to be fed to a load and/or, respectively, that is provided by a power source. For example, the dies described herein may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the respective die.

Without being limited thereto, the first power semiconductor die described in more detail below can be a power transistor, e.g., a MOSFET. The second power semiconductor die described in more detail below can be a power diode, e.g., a SiC-based diode. In another embodiment, both the first power semiconductor die and the second power semiconductor die are implemented as a respective diode. In yet another embodiment, both first power semiconductor die and second power semiconductor die are implemented as a respective transistor. In yet another embodiment, the first power semiconductor die is a diode, and the second power semiconductor die is a transistor.

The term "power semiconductor die" as used in this specification intends to describe a single die with high voltage blocking and/or high current-carrying capabilities. In other words, such power semiconductor die is intended for high current, typically in the Ampere range, e.g., up to 5 or 300 Amperes, and/or voltages typically above 15 V, more typically up to 40 V, and above, e.g., up to at least 500 V or more than 500 V, e.g. at least 600 V.

For example, the power semiconductor dies described herein may be dies configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

Before being able to be employed within an application, a power semiconductor die is usually included within a package that may allow mechanically mounting and electrically connecting the die within the application. For example, this may include applying a surface-mount technology (SMT).

Without being limited thereto, exemplary embodiments of the package described herein are surface-mount device (SMD) packages. For example, embodiments of the package disclosed herein are SMD packages with flat contacts that interface with a support, e.g., a PCB.

Figure 1B:
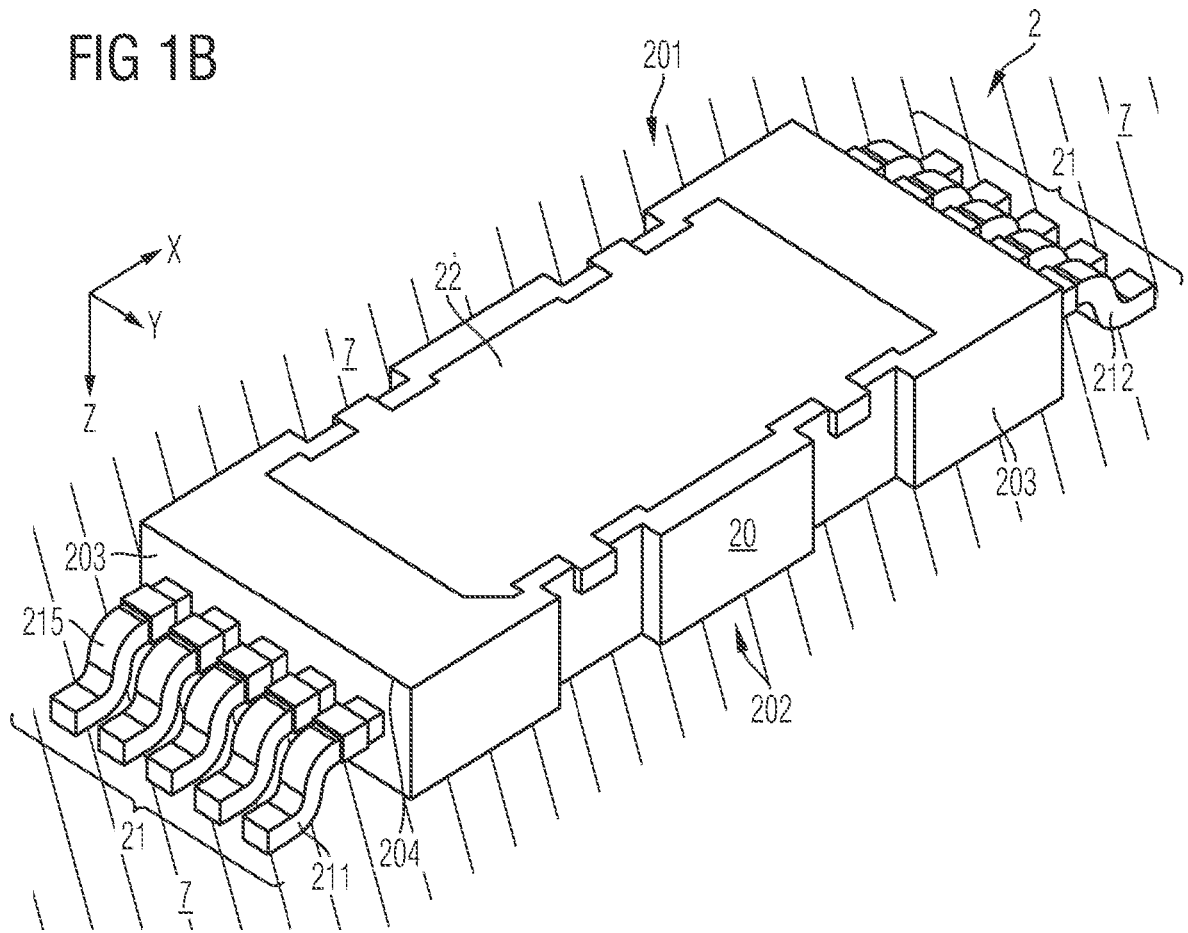

Both FIG. 1A and FIG. 1B schematically and exemplarily illustrate a section of a perspective view of a package 2 in accordance with some embodiments. The package 2 may have a package body 20 and exhibit a package top side 201 and a package footprint side 202. Package sidewalls 203 may extend from the package footprint side 202 to the package top side 201. For example, a package edge 204 is formed where the package top side 201 interfaces with the package sidewalls 203.

In accordance with the illustrated exemplary embodiments, the package 2 may exhibit an SMD configuration.

For example, in accordance with the embodiment illustrated in FIG. 1B, the package 2 may have a cooling top side (TSC) 22 and may hence exhibit an SMD-TSC-configuration. For example, the cooling top side 22 is formed by an exterior surface of a common base of a lead frame structure of the package 2, which will be explained in greater detail with respect to FIG. 3B.

The cooling top side 22 may be made of an electrically conductive material. For example, the cooling top side 22 is arranged substantially coplanar with the package top side 201; e.g., the cooling top side 22 does not or only little protrude from the package top side 201. The cooling top side 22 can have a horizontal surface area amounting to at least 50%, to at least 60% or to even more than 80% (but to less than 100%) of the total surface area of the package top side 201. This surface area may be exposed to the environment of the package body 20, i.e., the surface area of the cooling top side 22 is not enclosed within the package body 20, but forms a part of an exterior wall. The package 2 is, for example, a top side cooling (TSC) package with the package top side 201 being equipped with the cooling top side 22. For example, at least most of the heat to be dissipated leaves the package body 20 via the cooling top side 22.

But, the embodiments of the package 2 described herein are not limited to these exemplary configurations; in accordance with other embodiments, the package 2 may exhibit a configuration different from an SMD configuration. As illustrated in FIG. 1A, the package 2 may exhibit an SMD configuration different from an SMD-TSC-configuration.

For example, the package 2 is configured in accordance with the Through-Hole-Technology (not illustrated) instead of the SMD-Technology.

Figure 3A:
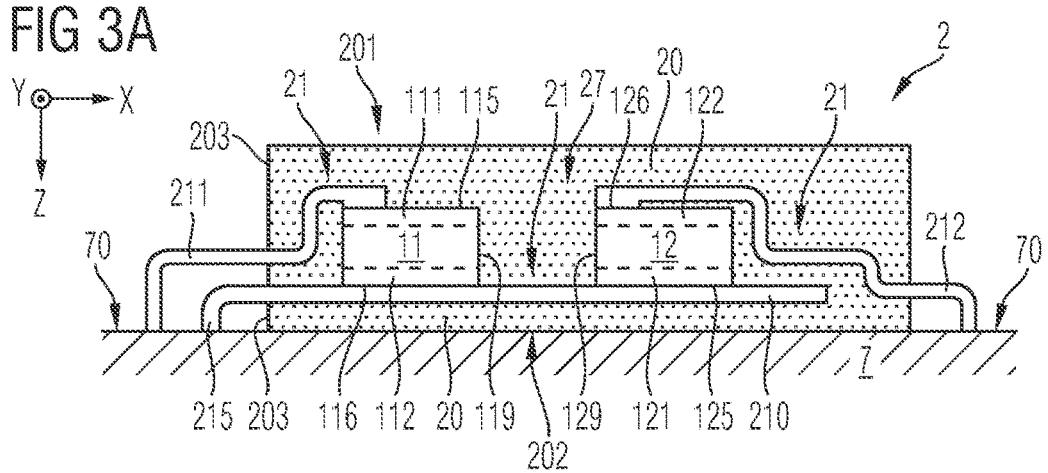
FIGS. 3A-3B each schematically and exemplarily illustrate a section of a vertical cross-section of a package in accordance with one or more embodiments.
Figure 3B:
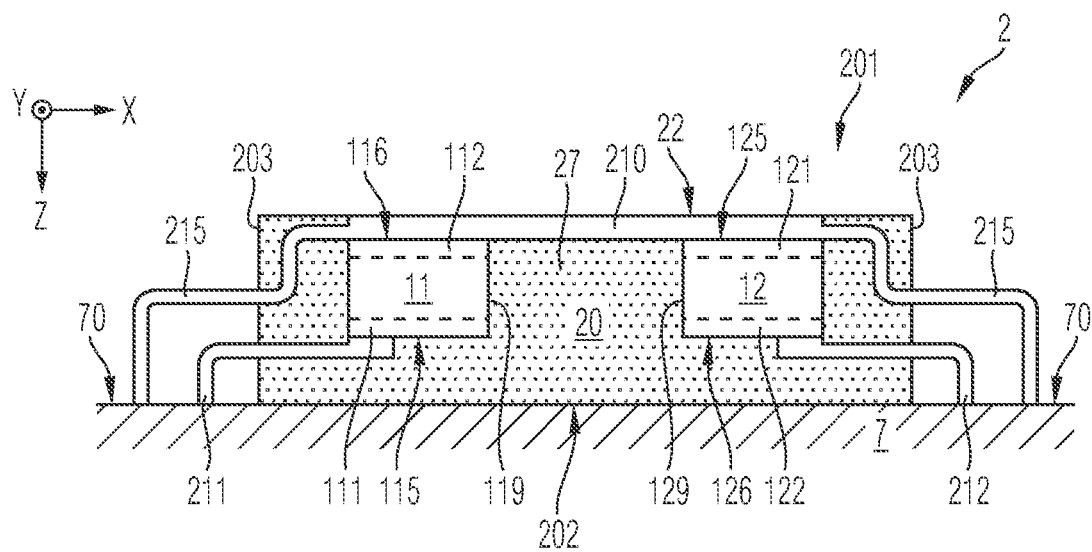

Now referring to each of FIGS. 1A-B and FIGS. 3A-B, the package 2 comprises a lead frame structure 21 that is configured to electrically and mechanically couple the package 2 to a support 7, e.g., with the package footprint side 202 facing to the support 7. The support 7 can be, e.g., a printed circuit board (PCB) or the like. For example, FIG. 3A shows a vertical cross-section of an embodiment of the package 2 illustrated in FIG. 1A. Further, FIG. 3B shows a vertical cross-section of an embodiment of the package 2 illustrated in FIG. 1B.

The lead frame structure 21 comprises a first outside terminal 211 extending out of the package body 20 and a second outside terminal 212 also extending out of the package body 20. As illustrated, there can be more than one first outside terminal 211 and more than one second outside terminal 212.

The first outside terminal(s) 211 may be electrically insulated from the second outside terminal(s) 212, e.g., at least within the interior of the package body 20.

For example, each of the first outside terminal(s) 211 and the second outside terminal(s) 212 is configured as a flat contact. Further, the first outside terminal(s) 211 and the second outside terminal(s) 212 may extend out of the package sidewalls 203 of the package 2, as exemplarily illustrated in FIGS. 1A-B.

Figure 2:
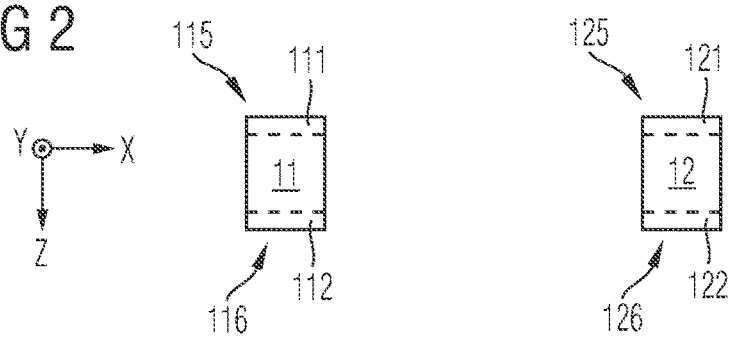
FIG. 2 schematically and exemplarily illustrates a section of a vertical cross-section of a first power semiconductor die and a section of a vertical cross section of a second power semiconductor die in accordance with one or more embodiments.

Now additionally referring to FIG. 2, the package 2 can enclose a first power semiconductor die 11 and a second power semiconductor die 12. For example, the first power semiconductor die 11 and the second power semiconductor die 12 are provided separately from each other. In an embodiment, a first process is employed for manufacturing the first power semiconductor die 11, which may be, e.g., a transistor, such as a MOSFET, and a second process, e.g., different from the first process, is employed for manufacturing the second power semiconductor die 12, which may be, e.g., a diode, such as a SiC-based diode. For example, the first power semiconductor die 11 is diced out of a semiconductor wafer including first type dies, and the second power semiconductor die 12 is diced out of another semiconductor wafer including second type dies. In another embodiment, both power semiconductor dies 11 and 12 are implemented as a respective diode (or as a respective transistor) and can, hence, be diced out of a common wafer. However, even if the power semiconductor dies 11, 12 are diced out of a common wafer, they are still provided separately from each other, in accordance with an embodiment.

In an embodiment, both the first power semiconductor die 11 and the second power semiconductor die 12 have been manufactured by subjecting the respective front sides 115, 125 to a plurality of processing steps including one or more of the following: an implantation processing step, an epitaxy processing step, a diffusion processing step, a deposition processing step, a lithographic processing step, an etching processing step.

For example, both front sides 115 and 125 are laterally structured, e.g., at least with respect to an active region and an edge termination region, and/or one or more additional terminal structures or the like.

In contrast, in an embodiment, both back sides 116 and 126 are not laterally structured, but may essentially consist of a respective homogenously formed back side metallization.

Both the first power semiconductor die 11 and the second semiconductor die 12 may exhibit a vertical configuration. For example, a first load terminal 111 of the first power semiconductor die 11 is arranged at the front side 115 of the first power semiconductor die 11, and the second load terminal 112 arranged at a back side 116. The back side 116 and the front side 115 are arranged opposite to each other.

Analogously, a first load terminal 121 of the second power semiconductor die 12 is arranged at a front side 125 of the second power semiconductor die 12, and a second load terminal 122 is arranged at a back side 126 of the second power semiconductor 12. The back side 126 and the front side 125 are arranged opposite to each other.

For example, the second load terminals 122 and 112 may comprise or, respectively, be made of a respective back side metallization. The first load terminals 111 and 121 may comprise or, respectively, be made of the respective front side metallization.

The first power semiconductor die 11 can be configured to conduct a first load current between its first load terminal 111 and its second load terminal 112 along a path in parallel to the vertical direction Z. Analogously, the second power semiconductor die 12 can be configured to conduct a second load current between its first load terminal 121 and its second load terminal 122 along a path in parallel to the vertical direction Z.

In an embodiment, when being installed within the package 2, the first load current of the first power semiconductor die 11 and the second load current of the second power semiconductor die 12 flow in the same direction.

In an embodiment, the first load terminal 111 of the first power semiconductor die 11 is one of a source terminal, an emitter terminal and an anode terminal. The second load terminal 112 of the first power semiconductor die 11 may be one of a drain terminal, a collector terminal and a cathode terminal. The first load terminal 121 of the second power semiconductor die 12 may be one of an anode terminal, a source terminal and an emitter terminal. The second load terminal 122 of the second power semiconductor die 12 may be one of a cathode terminal, a drain terminal and a collector terminal.

As explained above, the first power semiconductor die 11 can be a MOSFET or a diode, and the second power semiconductor die 12 can be a diode, e.g., a SiC-based diode.

Now referring in more detail to FIGS. 3A-B, the lead frame 21 may further comprise a common base 210. For example, the common base 210 serves as an electrically conducting mounting support for both the first power semiconductor die 11 and the second power semiconductor die 12 within the interior of the package body 20. Further, the common base 210 may form a part of an electrical connection between the second load terminal 112 (e.g., a drain terminal) of the first power semiconductor die 11 (e.g., a MOSFET) and the first load terminal 121 (e.g., an anode terminal) of the second power semiconductor die 12 (e.g., a diode).

The common base 210 may be a monolithic electrically conductive plate that is, e.g., arranged horizontally and at least partially within the interior of the package body 20. The monolithic electrically conductive plate may form the bottom of the package body 20 or, respectively, be slightly displaced from the bottom of the package body 20, e.g., by means of a layer formed of an insulating material 27, as illustrated in FIG. 3A. In another embodiment, e.g., if formed as a TSC-package 2 (cf. FIGS. 1B and 3B), the monolithic electrically conductive plate may be arranged within an upper portion of the package body 20 or, respectively, be slightly displaced from the package top side 201 inwards the package body 10 (e.g., also by means of a layer formed of an insulating material 27, not illustrated, similarly to FIG. 3A).

In an embodiment, as illustrated in FIG. 3B, the monolithic electrically conductive plate of the common base 210 has a surface exterior of the package body 20, said exterior surface forming the cooling top side 22 of the package 2.

The monolithic electrically conductive plate of the common base 210 has at least one interior surface onto which the first power semiconductor die 11 and the second power semiconductor die are mounted. The surface monolithic electrically conductive plate of the common base 210 opposite to this interior surface may also be an interior surface (as illustrated in FIG. 3A) or an exterior surface, as illustrated in FIG. 3B.

For example, as illustrated in FIG. 3A, the second load terminal 112 of the first power semiconductor die 11 is electrically connected to the common base 210 with its back side 116 facing to the common base 210 and its front side 115 facing to the package top side 201, wherein the first load terminal 121 of the second power semiconductor die 12 is electrically connected to the common base 210 with its front side 125 facing to the common base 210 and its back side 126 facing to the package top side 201. Thus, in case of the second power semiconductor die 12 being a diode, this configuration may constitute a so-called anode-down configuration. In another embodiment, as illustrated in FIG. 3B, the second load terminal 112 of the first power semiconductor die 11 is electrically connected to the common base 210 with its back side 116 facing to the common base 210 and its front side 115 facing to the package footprint side 202, wherein the first load terminal 121 of the second power semiconductor die 12 is electrically connected to the common base 210 with its front side 125 facing to the common base 210 and its back side 126 facing to the package footprint side 202. Thus, in the latter configuration, in case of the first power semiconductor die 11 being a MOSFET, this configuration may constitute a so-called source-down configuration.

For example, the common base 210 is arranged in either the lower portion of the interior of the package body 20 (cf. FIG. 3A) or in the upper portion of the interior of the package body 20 (cf. FIG. 3B). The interior of the package body 20, e.g., may include an insulating material 27, e.g., a mold compound.

As has been explained above, the second load terminal 112 of the first power semiconductor die 11 that is electrically connected to and mounted on the common base 210 may comprise a back side metallization. For example, such back side metallization is not structured, but formed homogeneously. Analogously, the second load terminal 122 of the second power semiconductor die 12 that is electrically connected to and mounted on the common base 210 may comprise a back side metallization. For example, also the back side metallization of the second power semiconductor die 12 is not structured, but formed homogeneously.

In contrast, as illustrated in FIG. 7, the front side 125 of the second power semiconductor die 12, where its first load terminal 121 is arranged, can be structured, e.g., at least with respect to an active region 127 and an edge termination region 128 surrounding the active region 127. For example, the edge termination region 128 extends laterally until it is terminated by the die edge 129, which may become into being by means of wafer dicing, for example. Hence, the first load terminal 121 of the second power semiconductor die 12 that is electrically connected to and mounted on the common base 210 may comprise a front side metallization and forms a part of the front side 125 that may be structured.

In an embodiment, the edge termination region 128 of the second power semiconductor die 12 may include, at the front side 125, at least one zone (not illustrated) configured to exhibit the electrical potential of the second load terminal 122 of the second power semiconductor die 12.

Analogously, the front side 115 of the first power semiconductor die 11, where its first load terminal 111 is arranged, can be structured, e.g., at least with respect to an active region and an edge termination region surrounding the active region and/or with respect to an insulated control terminal at the front side 115, as will be explained in more detail further below.

The lead frame structure 21 can further comprise a common outside terminal 215 that extends out of the package body 20 and that is electrically connected with the common base 210. For example, the common base 210 is arranged in the interior of the package body 20 fits seamlessly to the outside terminal 215, as schematically illustrated in FIGS. 3A and 3B.

The first outside terminal(s) 211 may be electrically connected to the first load terminal 111 of the first power semiconductor die 11 within the interior of the package body 20, and the second outside terminal(s) 212 of the lead frame structure 21 may be electrically connected to the second load terminal 122 of the second power semiconductor die 12 within the interior of the package body 20. The terminals 211, 212 and 215 may be electrically insulated from each other.

In contrast to the schematic illustration in FIGS. 3A and 3B, all terminals 211, 212 and 215 may traverse the package sidewall(s) 203 at the same vertical level, e.g., as illustrated in FIGS. 1A and 1B. Further, it is also possible that the lead frame structure 21 includes more than one common outside terminal 215, wherein such further common outside terminal (not illustrated) could extend from the common base 210 out of the interior of the package body 20 at the same package sidewall 203 as the second outside terminal 212.

As explained above, the first power semiconductor die 11 and the second power semiconductor die 12 are arranged separately from each other within the interior of the package body 20. For example, a distance along the first lateral direction X between an edge 119 of the first power semiconductor die 11 and an edge 129 of the second power semiconductor die 12 amounts to at least 20 μm.

For example, the first power semiconductor die 11 is a transistor or a diode, and the second power semiconductor die 12 is a diode. Hence, the second load terminal 112 of the first power semiconductor die 11 can be one of a drain terminal, a collector terminal and cathode terminal. As explained above, this second load terminal 112 can be arranged at the back side 116 of the first power semiconductor die 11, and this back side 116 may be mounted onto the common base 210 of the lead frame structure 21. The back side 116 of the first power semiconductor die 11 may consist of homogeneously formed back side metallization that forms (at least a part of) the second load terminal 12. For example, this back side metallization is soldered to the common base 210. Thus, the second load terminal 112 of the first power semiconductor die 11 may be arranged in contact with the common base 210.

The first load terminal 121 the second power semiconductor die 12 can be one of an anode terminal, a source terminal and an emitter terminal. As explained above, the first load terminal 121 is arranged at the front side 125 of the second power semiconductor die 12, and this front side 125 may be coupled to the common base 210 of the lead frame structure 21. Further details regarding the coupling between the front side 125 of the second power semiconductor die 12 and the common base 210 will be explained further below.

The common base 210 may be made of an electrically conductive material. Hence, the second load terminal 112 of the first power semiconductor die 11 and the first load terminal 121 of the second power semiconductor die 12 can be electrically connected, e.g., short-circuited, to each other by means of at least the common base 210.

An area of the interior surface of the common base 210 that faces to the back side 116 of the first power semiconductor die 11 and to the front side 125 of the second power semiconductor die 12 may be greater than the sum of the area of the front side 115 of the first power semiconductor die 11 and the area of the front side 125 of the second power semiconductor die 12. In an embodiment, both the front side 115 and the front side 125 laterally overlap with said interior surface of the common base 210 entirely.

Figure 5:
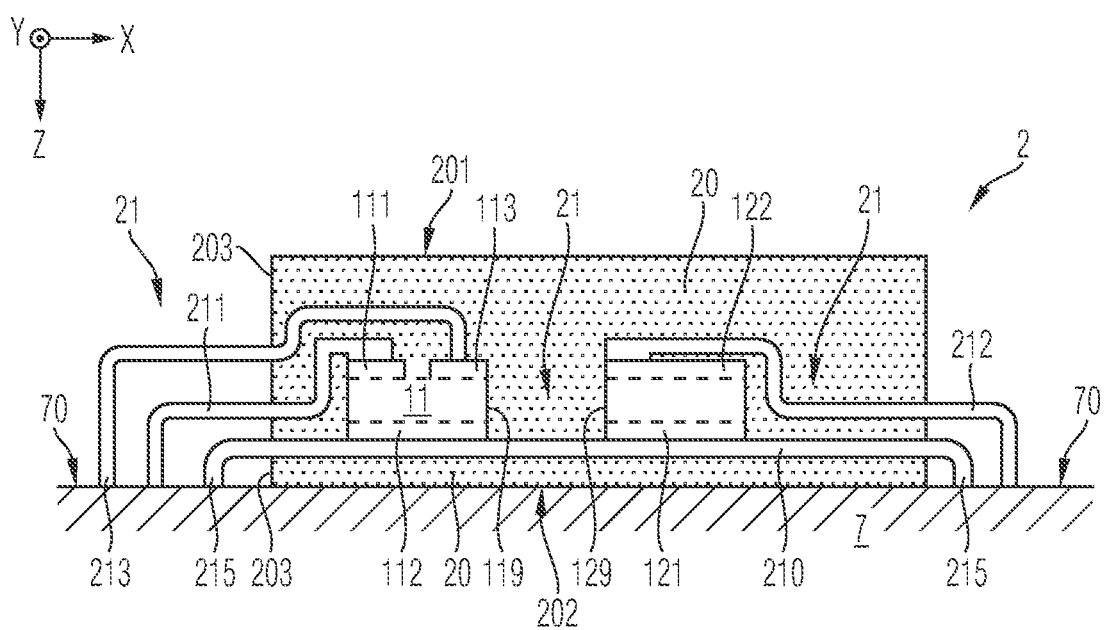
FIG. 5 schematically and exemplarily illustrates a section of a vertical cross-section of a package in accordance with one or more embodiments.

Now referring to FIG. 5, the first power semiconductor die 11 can further comprise a control terminal 113 at its front side 115, e.g., a gate terminal. For example, the control terminal 113 is configured to set, responsive to a corresponding control signal, the first power semiconductor die 11 into one of a conducting state and a blocking state. The control terminal 113 may be electrically insulated from each of the first load terminal 111 and the second load terminal 112 of the first power semiconductor die 11.

The lead frame structure 21 may further comprise a third outside terminal 213 extending out of the package body 20. The third outside terminal 213 may be electrically connected with the control terminal 113, e.g., by means of a gate runner (not illustrated) of the first power semiconductor die 11.

Each of the terminals 211, 212, 213 and 215 may be configured to be coupled to the support 7, e.g., a PCB, e.g., by means of employing a soldering processing step. Each of the terminals 211, 212, 213 and 215 may extend from out of the interior of the package body 20 to external of the package body 20.

In accordance with an embodiment, the technique of coupling the first power semiconductor die 11 to the common base 210 differs from the technique of coupling the second power semiconductor die 12 to the common base 210. With respect to the exemplary embodiments schematically illustrated in FIGS. 6A-B, this shall be explained in more detail.

Figure 6A:
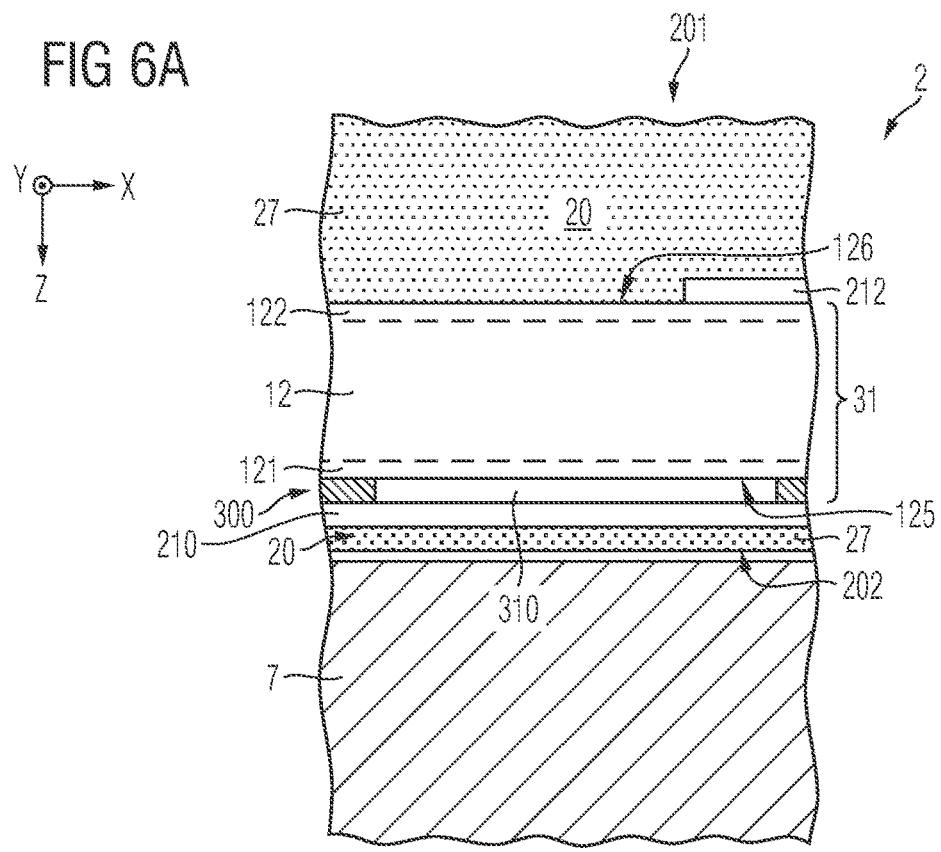
FIGS. 6A-6B both schematically and exemplarily illustrate a section of a vertical cross-section of a package in accordance with one or more embodiments.
Figure 6B:
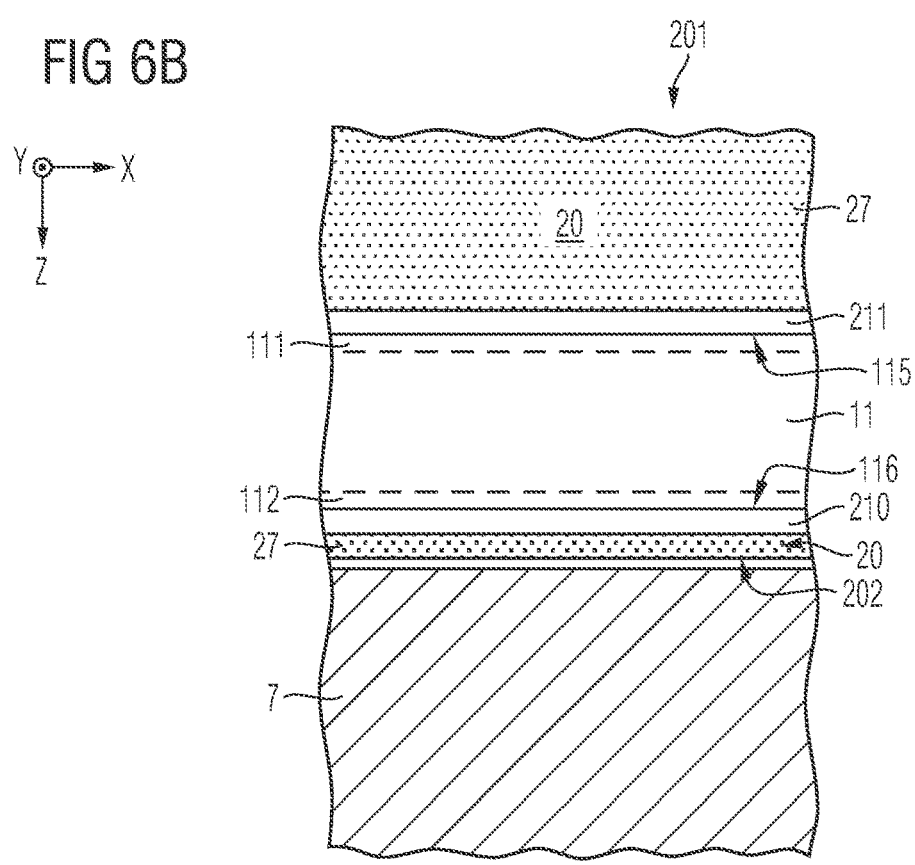

For example, as illustrated in FIG. 6B, the second load terminal 112 (which may comprise or, respectively, be made of said back side metallization at the back side 116) of the first power semiconductor die 11 is arranged in contact with the common base 210 of the lead frame structure 21. For example, a back side metallization of the first power semiconductor die 11 is directly mounted on the interior surface of the common base 210, e.g., by soldering.

In contrast, the first load terminal 121 (which may comprise or, respectively, be made of said front side metallization) of the second power semiconductor die 12 is spatially displaced from the common base 210, e.g., along the vertical direction Z, as illustrated in FIG. 6A. For example, whereas the front side metallization of the second power semiconductor die 12 may be electrically connected to the common base 210, it is not arranged in contact with the common base 210. It shall be understood that the manner of coupling the front side 125 of the second power semiconductor die 12 to the common base 210 as explained with respect to FIG. 6A may be applied to each of the embodiments illustrated in FIGS. 3A, 3B and 5.

Since the front side 125 of the second power semiconductor die 12 can be structured, as has been explained above, it may be appropriate to arrange the second power semiconductor die 12 vertically displaced from the interior surface of the common base 210, e.g. by a minimum distance of at least 50 µm, at least 200 µm, or of at least 550 µm. For example, due to the minimum distance between the interior surface of the common base 210 and the second power semiconductor die 12, it can be avoided that a homogenous distribution of the electrical potential of the common base 210 disturbs a course of an electric field present within the second power semiconductor die 12. Such course of an electric field may depend on the structure of the front side 125 of the second power semiconductor die 12. In an embodiment, the minimum distance between the second power semiconductor die 12 and the interior surface of the common base 210 is chosen such that presence of the common base 210 (and its homogenous distribution of the electrical potential) does not reduce a voltage rating (maximum blocking voltage) for which the second power semiconductor die 12 has been designed.

To this end, in an embodiment, the second power semiconductor die 12 may form a part of a stack unit 31, wherein the stack unit 31 is enclosed within the package 2, i.e., within the interior of the package body 20. The stack unit 31 can comprises a monolithic coupling layer 300 arranged between the common base 210 of the lead frame structure 21 and the front side 125 of the second power semiconductor die 12. The monolithic coupling layer 300 is, for example, made of an insulating material and has at least one passage 310 filled with an electrically conductive material. The at least one passage 310 forms the electrical connection between the first load terminal 121 of the second power semiconductor die 12 and the common base 210.

The coupling layer 300 may exhibit a minimum thickness along the vertical direction Z of at least 50 µm, at least 200 µm, or of at least 550 µm. For example, the configuration of the coupling layer 300 is adapted to a breakthrough voltage of the second power semiconductor die 12. As has been explained above, at the front side 125 of the power semiconductor die 12, there may also be arranged a zone exhibiting the electrical potential of the second load terminal 121 of the second power semiconductor die 12 or an electrical potential similar to this electrical potential of the second load terminal 121.

Hence, the monolithic coupling layer 300 can be configured to avoid a breakthrough along a lateral direction (e.g., direction X or Y), e.g., along a path between the active region 127 and the edge termination region 128, and along the vertical direction Z, e.g., along the path between the edge termination region 128 and the interior surface of the common base 210.

A lateral structure of the coupling layer 300 can be formed by the number of the passages 310, the position of the passages 310 and the dimensions of the passages 310. For example, the lateral structure of the coupling layer 300 can be configured in accordance with the structure of the front side 125 of the second power semiconductor die 12.

Further optional features of the coupling layer 300 will be explained in more detail below.

Figure 4:
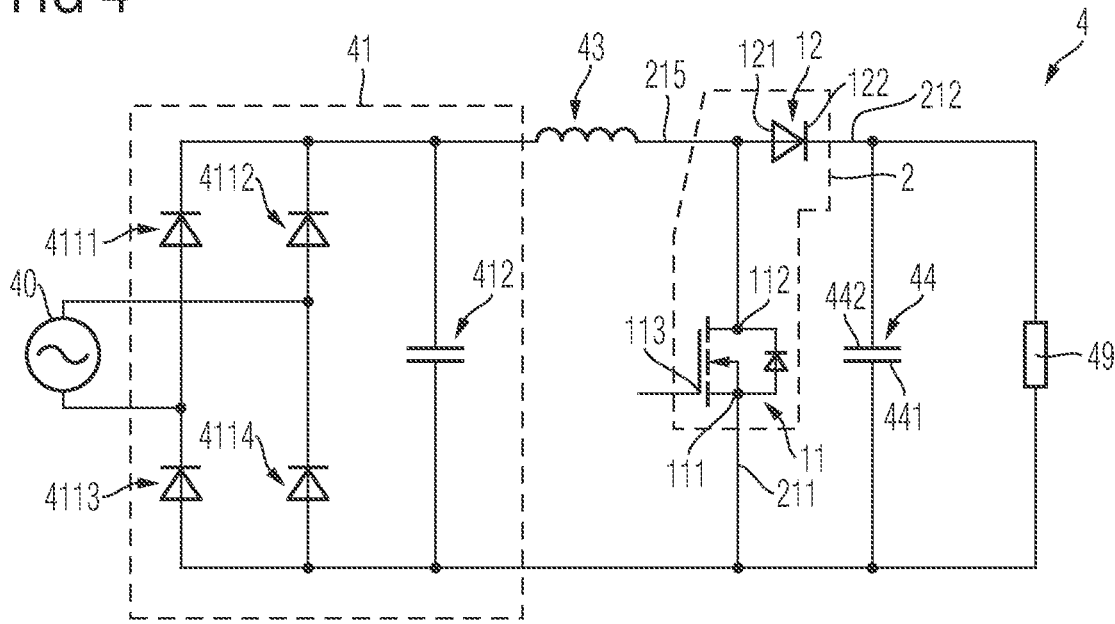
FIG. 4 schematically and exemplarily illustrates a section of a circuitry of a power converter in accordance with one or more embodiments.

Disclosed herein is also a power converter, an exemplary embodiment of which is schematically illustrated in FIG. 4. For example, the power converter 4 is configured to receive an input power signal from an input power source 40, e.g., an AC source, and to convert the input power signal into an output power signal, e.g., a DC signal, and to provide the output power signal for a load 49.

For example, the power source 40 provides an AC voltage, wherein this AC voltage is rectified by means of a diode bridge 41 of the power converter 4 and buffered by a buffer capacitor 412. The diode bridge 41 may comprise at least four diodes 4111 to 4114 arranged so as to convert the AC voltage into a DC voltage buffered by the buffer capacitor 412.

Downstream of the buffer capacitor 412, there may be arranged a coil 43 and, downstream thereof, a smoothing capacitor 44 connected in parallel to the load 49.

A power semiconductor arrangement comprising a first power semiconductor die 11, which is a MOSFET in the illustrated example, and a second power semiconductor die 12, which is a diode in the illustrated example, is arranged between smoothing capacitor 44 and the coil 43.

The power converter 4 comprises at least one package 2 that may be configured in the same manner as one of the embodiments described above. Hence, the single package 2 can integrate both the diode 12 and the MOSFET 11, wherein the diode 12 and the MOSFET 11 are arranged within the interior of the package body 20, e.g., in a manner as illustrated in FIG. 5. The common outside terminal 215 that is electrically connected to the common base 210 or, respectively, forms an integral part thereof, is electrically connected to the coil 43 in a region external of the package body 20. Within the interior of the package body 20, the common outside terminal 215 is electrically connected to, by means of the common base 210, to each of the drain terminal 112 of the MOSFET 11 and the anode terminal 121 of the diode 12.

As exemplarily illustrated, diode 12 and MOSFET 11 are not electrically connected in parallel to each other; only the drain terminal 112 of the MOSFET 11 and the anode terminal 121 of the diode 12 exhibit the same electrical potential. The source terminal 111 of MOSFET 11 and the cathode terminal 122 of diode 12 are not electrically connected to each other. Rather, the first outside terminal 211 (electrically connected to the source terminal 111) is electrically connected to a first terminal 441 of the smoothing capacitor 44, and the second outside terminal 212 (electrically connected to the cathode terminal 122) is electrically connected to a second terminal 442 of the smoothing capacitor 44.

The power converter 4 disclosed herein is not limited to the circuit configuration schematically and exemplarily illustrated in FIG. 4. Rather, the power converter 4 can exhibit an arbitrary configuration that includes at least two separate power semiconductor dies that are arranged within a single package 2, e.g., in a manner as exemplarily illustrated above.

Further, in addition or in alternative to the package 2 that integrates both the MOSFET 11 and the diode 12, another package (not illustrated) may integrate both diodes 4111 and 4113 and/or yet another package (not illustrated may integrate both diodes 4112 and 4114. The integration of diodes 4111 and 4113 (and/or of diodes 4112 and 4114) may occur in a manner as explained, e.g., with respect to FIGS. 3A and 3B. For example, both the anode terminal of diode 4111 and the cathode terminal of diode 4113 face to the common base of the package that integrates these two diodes 4111 and 4113 and are electrically connected to this common base.

Figure 10:
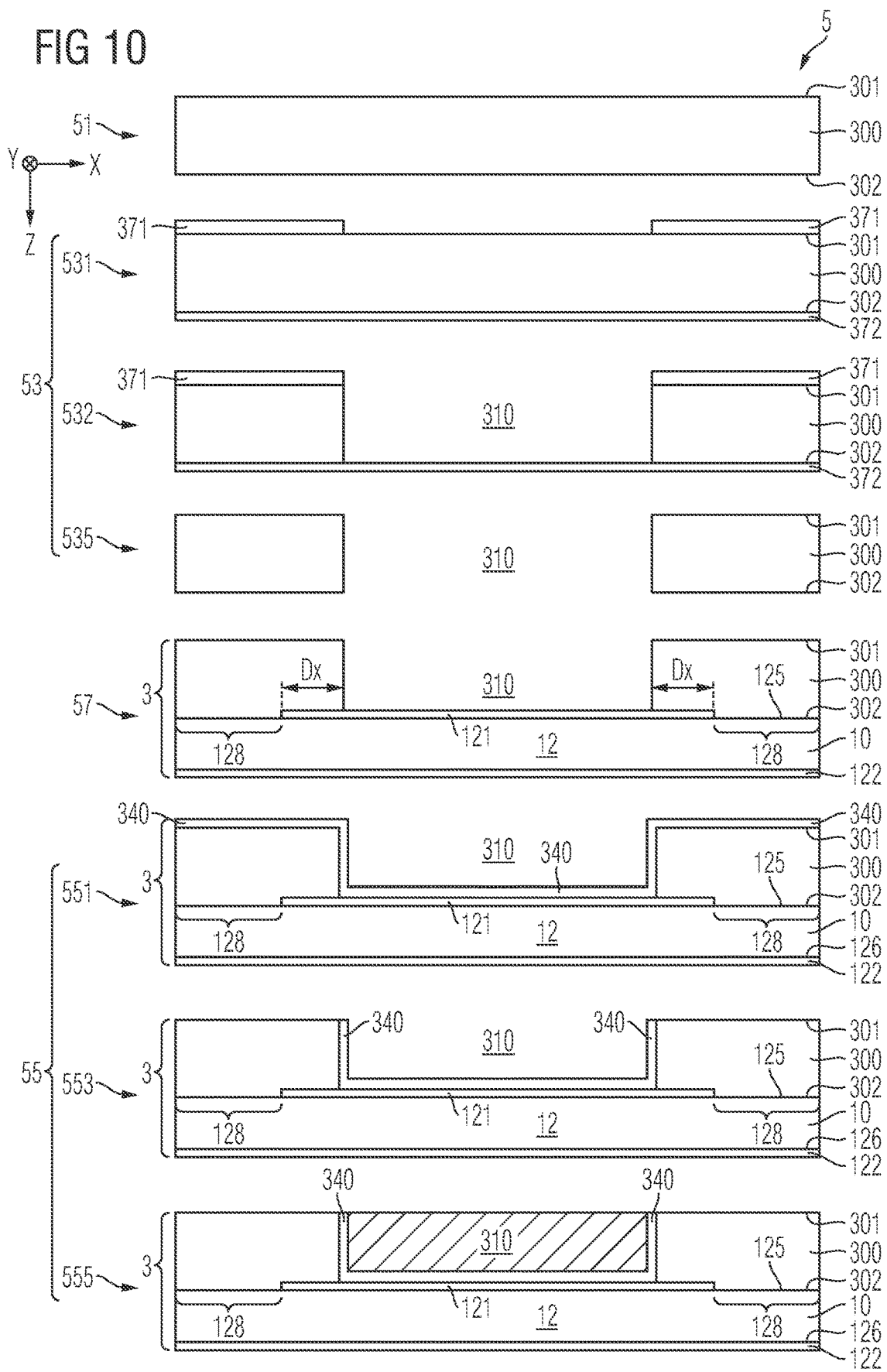
FIG. 10 schematically and exemplarily illustrates, based on sections of vertical cross-sections, a flow-diagram of a method in accordance with one or more embodiments.

Presented herein is also a method, exemplary embodiments of which are schematically and exemplarily illustrated in FIGS. 8 to 10.

For example, referring to FIG. 8, method 5 may comprise providing a processed first wafer 10 (cf. step 57), the first wafer 10 having a front side 125 and a back side 126 and including a plurality of power semiconductor dies 12 that have been implemented within the first wafer 10 by processing its front side 125, each of the power semiconductor dies 12 having a first load terminal 121 at the front side 125 and a second load terminal 122 at the back side 126.

For example, the above described second power semiconductor die 12 can be one of the dies included in the provided first semiconductor wafer 10. In other words, the provided first semiconductor wafer 10 may include a plurality of second power semiconductor dies 12. For example, each of the second power semiconductor dies 12 is implemented as a respective diode. In another embodiment, the second power semiconductor dies 12 exhibit a configuration different from a diode configuration, e.g., a transistor configuration.

At the back side 126 of the first wafer 10, there may be arranged a homogenously formed, unstructured back side metallization which may form (at least a part of) all second load terminals 122 of all power semiconductor dies 12 integrated within the first wafer 10.

The provided processed first wafer 10 may include a plurality of dicing areas 18 that separate the power semiconductor dies 12 from each other. The power semiconductor dies 12 may arranged within respective die areas 17 of the provided processed first wafer 10. For example, each die area 17 includes one power semiconductor die 12. At the front side 125, each die area 17 may be structured, e.g., at least with respect to an active region (cf. active region 127 illustrated in FIG. 7) and an edge termination region (cf. edge termination region 128 illustrated in FIG. 7). For example, the dicing areas 18 border to the edge termination regions 128 of the die areas 17.

For example, one or more dicing processing steps, e.g., one or more laser dicing processing steps, can be carried out along the dicing areas 18 so as to cut out the separate power semiconductor dies 12.

In an embodiment, before the provided processed first wafer 10 is separated into the separate power semiconductor dies 12, an unprocessed second wafer 30 is provided, cf. step 51. The second wafer 30 is schematically and exemplarily illustrated in the upper section of FIG. 8 at four different processing stages I-IV of method 5 that may occur after providing the second wafer 30.

For example, the second wafer 30 is made of an electrically insulating material, e.g. a glass, and has a first side 301 and a second side 302 opposite thereof. In an embodiment, the second wafer 30 is a bare glass wafer. As used herein, the term "unprocessed" means that the second wafer 30 does not include one or more integrated power semiconductor dies or the like. The term "unprocessed" however does not exclude that the second wafer 30 has, before being provided, somehow been processed. E.g., before being provided, the second wafer 30 can have been previously been subjected to a cleaning processing step, a grinding processing step, and/or polishing processing step.

The provided second wafer 30 (cf. stage I) may then be subjected to a plurality of processing steps.

In an embodiment, at least one of the processing steps to which the second wafer 30 is subjected is carried out in dependence on the configuration of the first wafer 10, e.g., in dependence on the pattern formed by the die areas 17 and dicing areas 18, e.g., based on the lateral structure of the front side 125. For example, one or more of the processing steps to which the second wafer 30 is subjected is carried out at least based on the position and the sizes of the first load terminals 121 arranged at front side 125.

For example, in step 532 a plurality of recesses 310-1 are formed within the second wafer 30. For example, for each die area 17, e.g., for each first load terminal 121, one separate recess 310-1 is formed.

For example, the first load terminals 121 of the provided first wafer 10 are arranged in accordance with a layout structure, wherein forming (cf. step 53) the plurality of recesses 310-1 within the second wafer 30 is carried out in dependence of the layout structure. For example, a grid size as used for forming the die areas 17 is also used for forming the recesses 310-1, or a grid size smaller than the grid size used for forming the die areas 17. Each recess 310-1 may have a rectangular horizontal cross-section, e.g., with rounded corners. In another embodiment, each recess 310-1 has a circular or ellipsoidal cross-section.

The recesses 310-1 can be formed on the first side 301 such that they extend in a well-like manner into the second wafer 30. For example, in accordance with an embodiment schematically illustrated in FIG. 8, the recesses 310-1 do not pass through the second wafer 30. In another embodiment, as will be explained with respect to FIGS. 9 and 10, before further processing, the recesses 310-1 are formed, either within a single processing step or within several processing steps as pass-through passages 310.

Forming the recesses 310-1 can include lithographic and etch processing steps. Each recess 310-1 may exhibit a depth of at least some μm, depending on a minimum thickness required, e.g., for ensuring voltage breakthrough properties.

Then, the recesses 310-1 are filled with a conductive material, cf. step 55/stage IV, cross-hatched area. This may include a galvanic plating processing step, wherein, e.g., copper can be used as the conductive material. Before filling, a seed layer may be deposited, e.g., sputtered, wherein the seed layer may comprise a titanium (or a titanium-tungsten) sublayer and a copper sublayer. The seed layer may afterwards be partially removed, e.g., from mesa regions between the recesses 310-1, e.g., by means of a polishing processing step, such as a chemical-mechanical planarization (CMP) step.

As a preparatory step 534 (cf. stage III), one or more stripe trenches 311 may be provided that extend laterally through a respective subset of the plurality of recesses 310-1 and which facilitate the filling step 55. For example, all stripe trenches 311 join into an outermost filling well 317 of the second wafer 30, wherein the filling well 317 may serve as a recipient of the conductive material.

In step 57, a stack 3 is formed by attaching, subsequent to said filling step 55, the second wafer 30 to the front side 125 of the first wafer 10, wherein the conductive material electrically contacts the first load terminals 121 of the power semiconductor dies 12.

For example, each of the first load terminals 121 is surrounded by an edge termination region 128 of the respective power semiconductor die 12, wherein, while said attaching step 57 is carried out, it is ensured that the edge termination region 128 is covered only by the insulating material of the second wafer 30 and not by the electrically conductive material. This will be elucidated in more detail with respect to the variants described with respect to FIGS. 9 and 10.

Attaching the first wafer 10 and the second wafer 30 to each other may comprise a wafer bonding processing step.

It is ensured that the conductive material provides an electrical connection between the first side 301 and the second side 302 of the second wafer 30. In accordance with the embodiment illustrated in FIG. 8, this can be accomplished by removing sections of the second side 302 (cf. step 533), e.g., by subjecting the second side 302 to an ablation processing step, e.g., a grinding processing step, such that the formed recesses 310-1 now form pass-through passages 310 that entirely penetrate the second wafer 30.

Finally, in step 59, the stack 3 can be subjected to a separation, e.g., dicing processing step, according to which the stack is diced along dicing lines (illustrated by means of the three vertical arrows in FIG. 8) and a plurality of stack units 31 is provided.

As has been explained above, such stack unit 31 can be enclosed, together with the first power semiconductor die 11, in a single package 2. The section of the second wafer 30 that forms a part of the stack unit 31 then provides for said monolithic coupling layer 300, wherein the conductive material included in the passages 310 contacts each of the common base 210 and the first load terminal 121.

Thus, for example, forming the plurality of recesses 310-1 within the second wafer 30 may include, before (cf. variants accordance with FIGS. 9-10) or after filling (cf. FIG. 8) the plurality of recesses 310-1 with the conductive material, transforming the recesses 310-1 into pass-through passages 310 (also referred to as passages 310 herein)

In other words, method 5 may comprise configuring the second wafer 30 as the coupling layer 300, wherein one of the first side 301 and the second side 302 of the second wafer 30 is being configured to be coupled to a lead frame structure 21 of a package 2.

For example, method 5 can further comprise separating (cf. step 59) the stack 3 into a plurality of stack units 31 and arranging at least one of the stack units 31 within a package body 20 of the package 2, wherein arranging the at least one stack unit 31 includes electrically connecting the conductive material with the lead frame structure 21 of the package 2.

With respect to FIGS. 9 and 10, variants of method 5 shall be described.

For example, the unprocessed second wafer 30 is provided in step 51. Within step sequence 53, the passages 310 are formed, i.e., before said filling step is carried out. Forming the passages 310 may occur by processing both the first side 301 and the second side 302 (as illustrated in FIGS. 8 and 9) or by processing the first side 301 only (as illustrated in FIG. 10).

In step 531, a first layer 371, e.g., a masking layer, is provided on the first side 301 of the second wafer 30 (wherein FIGS. 8 and 9 only illustrate a wafer section 300 that may later form the coupling layer). Further, a second layer 372, e.g., a masking or support layer, is provided at the second side 302, cf. step 531 in FIGS. 9 and 10. For example, in accordance with the embodiment of FIG. 9, the first layer 371 and the second layer 372 can exhibit the same lateral structure and are laterally aligned to each other. Providing the layers 371 and 372 may include one or more double-sided lithographic processing steps, or, in accordance with the embodiment of FIG. 10, one or more single-sided lithographic processing steps.

In step 532, the second wafer 30 may be subjected to one or more removal steps, e.g., one or more etch processing steps. For example, in accordance with the embodiment illustrated in FIG. 10, the removal step is carried out so as to form the pass-through passage 310. In accordance with the embodiment illustrated in FIG. 9, both the first side 301 and the second side 302 may be subjected to a respective etch processing step, thereby creating the recesses 310-1 (extending from the first side 301 into the second wafer 30) and 310-2 (extending from the second side 302 into the second wafer 30) that unite so as to form passage 310.

Depending on how the removal step 532 is carried out, an etch nose 315 may come into being that extends laterally into the passage 310, as illustrated (in an exaggerated manner) in FIG. 9. For example, the etch nose 315 may come into being due to the two etch flanks caused by the double-sided etch processing step. Thereafter, within processing step 535, the first layer 371 (and, if present, the second layer 372) may be removed, and, optionally, an adhesive may be provided on the side of the second wafer 30 (e.g., the second side 302) that will be coupled to the first wafer 10.

In accordance with the embodiments illustrated in FIGS. 9 and 10, within step 57, the second wafer 30 is attached to the first wafer 10 while already exhibiting the pass-through passage 310, wherein the pass-through passage 310 is void and, e.g., not yet filled with the electrically conductive material. In contrast, in accordance with the embodiment schematically illustrated in FIG. 8, the second wafer 30 is attached to the first wafer 10 while the recesses 310-1 is filled with the electrically conductive material.

Returning to FIGS. 9 and 10, as illustrated with respect to step 57, each passage 310 can have smaller horizontal cross-section area as compared to the horizontal cross-ssection area of the second load terminal 122 of the power semiconductor die 12. As has been explained above, e.g., with respect to FIG. 7, the active region 127 of the power semiconductor die 12 can be surrounded by the edge termination region 128. For example, within the edge termination region 128 and at the front side 125, there may also be arranged a zone (not illustrated) that provides the electrical potential of the second load terminal 122 or another electrical potential that is not be short-circuited with the first load terminal 121.

In accordance with an embodiment, the insulating material of the second wafer 30 and the spatial dimensions of the passage 310 may be designed so as to avoid a breakthrough between the electrical conductive material present within the passage 310 (cf. description below) and the edge termination structure 128.

For example, the second wafer 30 can be configured, e.g., by means of its insulating material and the spatial dimensions of the passage 310, with a breakthrough voltage at least as great as a breakthrough voltage of the second power semiconductor die 12.

For example, the second wafer 30 may be attached to the first wafer 10 such that the insulating material surrounding the passage 310 laterally overlaps with the first load terminal 121 by a minimum length Dx of at least 5 µm. Further, the minimum thickness along the vertical direction Z of the passage 310 can amount to at least 50 µm, at least 200 µm, or to at least 550 µm.

As explained above, the second wafer 30 may be made of a glass. In another embodiment, the second wafer is made of another insulating material, e.g., another high voltage dielectric.

For filling the passage 310 with a conductive material (cf. step sequence 55), a seed layer 340 may be deposited, e.g., sputtered, within step 551, on the first side 301 of second wafer 30 and on the section of the first load terminal 121 exposed by the passage 310. If said etch nose 315 is present, this coupling layer may exhibit an interruption along the vertical direction Z, as illustrated in FIG. 8.

Thereafter, within step 553, the seed layer 340 is partially removed, e.g., by carrying out lithographic and etch processing steps or by means of a polishing processing step, such as a chemical-mechanical planarization (CMP) step. The seed layer 340 is, e.g., removed from a surface of the first side 301 that does not form the passage 310, e.g., at mesa regions between adjacent passages 310, as illustrated in both FIG. 9 and FIG. 10.

Thereafter, in step 555, the passage 310 may be filled with an electrically conductive material, e.g., copper. This may include a galvanic plating processing step. The electrically conductive material may be deposited on top of the seed layer 340. If said etch nose 315 is present, empty spaces 350 may come into being which remain at least substantially void.

The passage 310 filled with the electrically conductive material may then provide for the electrical connection between the first load terminal 121 of the second power semiconductor die 12 and the common base 210, as explained above.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
providing a processed first wafer having a front side, a back side and including a plurality of power semiconductor dies that have been implemented within the processed first wafer by processing its front side, each power semiconductor die having a first load terminal at the front side and a second load terminal at the back side;
providing an unprocessed second wafer made of an electrically insulating material and having a first side and a second side opposite thereof;
forming a plurality of recesses within the second wafer;
filling the plurality of recesses with a conductive material;
forming a stack by attaching, prior or subsequent to filling the plurality of recesses with the conductive material, the second wafer to the front side of the first wafer, the conductive material electrically contacting the first load terminals of the power semiconductor dies; and
ensuring that the conductive material provides an electrical connection between the first side and the second side of the second wafer.

2. The method of claim 1, further comprising configuring the second wafer as a coupling layer, wherein one of the first side and the second side of the second wafer is being configured to be coupled to a lead frame structure.

3. The method of claim 2, further comprising:
separating the stack into a plurality of stack units; and
arranging at least one of the stack units within a package body of a package, wherein arranging the at least one stack unit includes electrically connecting the conductive material with the lead frame structure.

4. The method of claim 1, wherein each first load terminal is arranged in accordance with a layout structure, and wherein forming the plurality of recesses within the second wafer is carried out in dependence of the layout structure.

5. The method of claim 1, wherein each first load terminal is surrounded by an edge termination region of the respective power semiconductor die, and wherein, while attaching the second wafer to the front side of the first wafer, ensuring that the edge termination region is covered only by the insulating material of the second wafer.

6. The method of claim 1, wherein forming the plurality of recesses within the second wafer comprises, before or after filling the plurality of recesses with the conductive material, transforming the recesses into pass-through passages.

* * * * *